(12) United States Patent
Nii et al.

(10) Patent No.: US 6,717,223 B2
(45) Date of Patent: Apr. 6, 2004

(54) SEMICONDUCTOR DEVICE WITH INTEGRALLY FORMED WELL CONTACT AREAS

(75) Inventors: Koji Nii, Tokyo (JP); Yoshiki Tsujihashi, Tokyo (JP); Hisashi Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/211,376

(22) Filed: Aug. 5, 2002

(65) Prior Publication Data
US 2003/0034572 A1 Feb. 20, 2003

(30) Foreign Application Priority Data

Aug. 14, 2001 (JP) ........................................ 2001-246109

(51) Int. Cl.⁷ ............................................. H01L 31/113
(52) U.S. Cl. ........................ 257/393; 257/903; 257/904
(58) Field of Search ........................ 257/393, 69, 195, 257/204, 206, 338, 350, 351, 357, 339, 365–367, 903, 904; 438/128, 129, 152, 155, 208, 220, 223, 224, 227, 228, 257, 284, 309

(56) References Cited

U.S. PATENT DOCUMENTS 6,469,325 B1 * 10/2002 Ishizuka et al. ............. 257/173
6,469,347 B1 * 10/2002 Oda et al. .................... 257/345

FOREIGN PATENT DOCUMENTS

JP  2001-028401  1/2001

* cited by examiner

Primary Examiner—David Nelms
Assistant Examiner—Long Tran
(74) Attorney, Agent, or Firm—Burns, Doane, Swecker & Mathis, LLP

(57) ABSTRACT

N well contact area 13 is integrally formed with second diffused area 12 within the upper parts of a N well and a P well, and P well contact area 14 is integrally formed with first diffused area 11 in the upper parts of the P well and the N well.

6 Claims, 4 Drawing Sheets

SEMICONDUCTOR DEVICE WITH INTEGRALLY FORMED WELL CONTACT AREAS

BACKGROUND OF THE INVENTION

1. Field of the Invention

The present invention relates to a semiconductor memory device in which the memory cell of a CMOS static RAM is formed.

2. Description of the Prior Art

FIG. 4 is a top surface view of the main part showing a conventional semiconductor memory device. Referring to the figure, P-type-impurities-implanted diffused area 1 is formed in the upper part of a strip-shaped N well, N-type-impurities-implanted diffused area 2 is formed in the upper part of a strip-shaped P well adjacent to the N well, N-type-impurities-implanted N well contact area 3 is formed in the upper part of the N well, and P-type-impurities-implanted P well contact area 4 is formed in the upper part of the P well.

The operation will next be described.

A semiconductor memory device has a plurality of memory cells formed in a matrix state therein. When a memory cell of one bit is a Full-CMOS type SRAM memory cell consisting of six transistors for instance, the memory cell is formed extending across at least one N well and one P well.

An example in which a N well and a P well are alternately formed in rows is shown in FIG. 4. Each of wells constitutes a gate electrode on an active-layer area to be implanted by impurities, to thereby form a transistor. The active-layer area implanted by impurities corresponds to the source terminal and the drain terminal of the transistor.

Impurities of a conduction type opposing the conduction type of the well are implanted into the areas where the source terminal and the drain terminal of the transistor are formed. For instance, a PMOS transistor is formed by means of implanting P type impurities into a N well (A PMOS transistor is formed within diffused area 1). On the other hand, a NMOS transistor is formed by means of implanting N type impurities into a P well (A NMOS transistor is formed within diffused area 2). Incidentally, because the active layer of the area into which impurities of the same conduction type as the type of the well were implanted is in a state electrically connected with the well, the active layer forms a well contact area (N well contact area 3 and P well contact area 4) for fixing the electric potential of the well.

A well contact area is provided for a plurality of memory cell rows in order to give a predetermined fixed potential to each of the wells.

That is, in order to reduce the size of the cell, the well contact for giving the well potential is not provided within the memory cell of one bit. However, in order to uniformly give the potential to each of the wells, it is necessary to arrange the well contacts at intervals of the extent to which the voltage drop caused by the resistance component of the well can be sufficiently neglected. For instance, a well contact area is provided on every 32 rows or 64 rows of memory cells.

Because the conventional semiconductor memory device has been arranged as mentioned above, N well contact area 3 formed in the upper part of the N well has the conduction type opposing the conduction type of diffused area 1 constituting the row of memory cells because impurities of the same conduction type as the conduction type of the N well are implanted thereinto. In a similar manner, P well contact area 4 formed in the upper part of the P well has the conduction type opposing the conduction type of diffused area 2 constituting the row of memory cells because impurities of the same conduction type as the conduction type of the P well are implanted thereinto. For this reason, because N well contact area 3 and P well contact area 4 become isolated-small-island shaped, a highly developed microfabrication technology for forming these areas is required. As a result, there has been a drawback that these areas are occasionally not successfully formed.

For instance, in the process in which N well contact area 3 and P well contact area 4 are manufactured, the disappearance or fall of a resist remaining in an island shape is caused in the photolithographical process, and thereby the implantation of impurities is occasionally not successfully performed.

SUMMARY OF THE INVENTION

The present invention has been accomplished to solve the above-mentioned problem, and an object of the present invention is to provide a semiconductor memory device in which the occurrence of the disappearance or fall of the resist is suppressed, to thereby reduce the occurrence of defectives in the manufacturing process.

According to a first aspect of the present invention, there is provided a semiconductor memory device in which a N well contact area is integrally formed with a second diffused area in the upper parts of a N well and a P well, and a P well contact area is integrally formed with a first diffused area in the upper parts of the P well and the N well.

Here, the N well contact area and the P well contact area may be alternately formed in the direction of a row.

In addition, a power line for supplying electric power to the N well may be wired within the N well contact area, and a grounding conductor for grounding the P well may be wired within the P well contact area.

At least one row of memory cells can be formed between the N well contact area and the P well contact area.

A signal line for timing adjustment can be wired within the N well contact area.

Alternatively, a signal line for timing adjustment can be wired within the P well contact area.

DETAILED DESCRIPTION OF THE PREFERRED EMBODIMENTS

An embodiment of the present invention will be described below.

Embodiment 1

Figure 1:
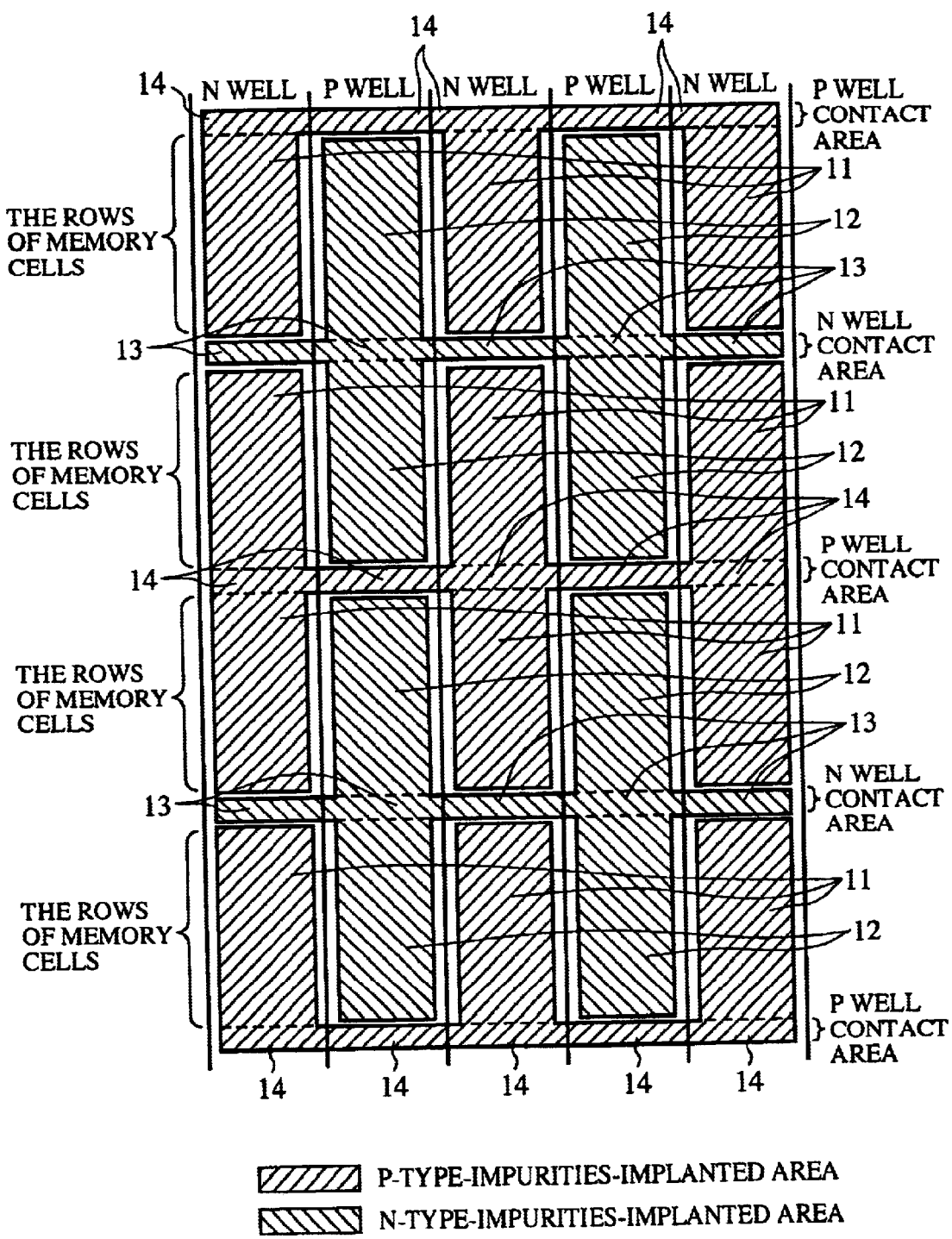
FIG. 1 is a top surface view of the main part showing the semiconductor memory device according to an embodiment 1 of the present invention.

FIG. 1 is a top surface view of the main part showing the semiconductor memory device according to an embodiment 1 of the present invention. Referring to the figure, first diffused area 11 implanted by P type impurities is formed in the upper part of a strip-shaped N well, second diffused area 12 implanted by N type impurities is formed in the upper part of a strip-shaped P well, N well contact area 13 is integrally formed with second diffused area 12 in the upper parts of the N well and the P well, and P well contact area 14 is integrally formed with first diffused area 11 in the upper parts of the P well and the N well.

The operation will next be described.

For the semiconductor memory device shown in FIG. 1, when a plurality of memory cells are formed in a matrix state, first diffused area 11 is formed by implanting P type impurities having a conduction type opposing the conduction type of the N well into the upper part of the strip-shaped N well, and second diffused area 12 is formed by implanting N type impurities having a conduction type opposing the conduction type of the P well into the upper part of the strip-shaped P well.

Furthermore, N well contact area 13 is formed serving as an area in which a power line for supplying electric power to the N well is wired, and P well contact area 14 is formed serving as an area in which a grounding conductor for grounding the P well is wired.

Herein, because N well contact area 13 is an area implanted by N type impurities having the same conduction type as the conduction type of the N well, N well contact area 13 must be kept in a state in which the area is not contacted with first diffused area 11. However, there is not inconvenience even if the area is in contact with second diffused area 12. Accordingly, when N well contact area 13 is formed, it is possible to integrally form the area with second diffused area 12.

In a similar manner, because P well contact area 14 is an area implanted by P type impurities having the same conduction type as the conduction type of the P well, P well contact area 14 must be kept in a state in which the area is not contacted with second diffused area 12. However, there is not inconvenience even if the area is in contact with first diffused area 11. Accordingly, when P well contact area 14 is formed, it is possible to integrally form the area with first diffused area 11.

Incidentally, there is a possibility that a short circuit is established between VDD and GND because of involving foreign matter when adjacently wiring the power line and the grounding conductor. In the embodiment 1, in order to prevent the occurrence of the short circuit between VDD and GND, N well contact area 13 for wiring the power line and P well contact area 14 for wiring the grounding conductor are independently formed.

Moreover, in order to uniformly give power supply potential VDD to the N well and uniformly give ground potential GND to the P well, N well contact area 13 and P well contact area 14 are alternately disposed on every a plurality of rows of memory cells.

Figure 2:
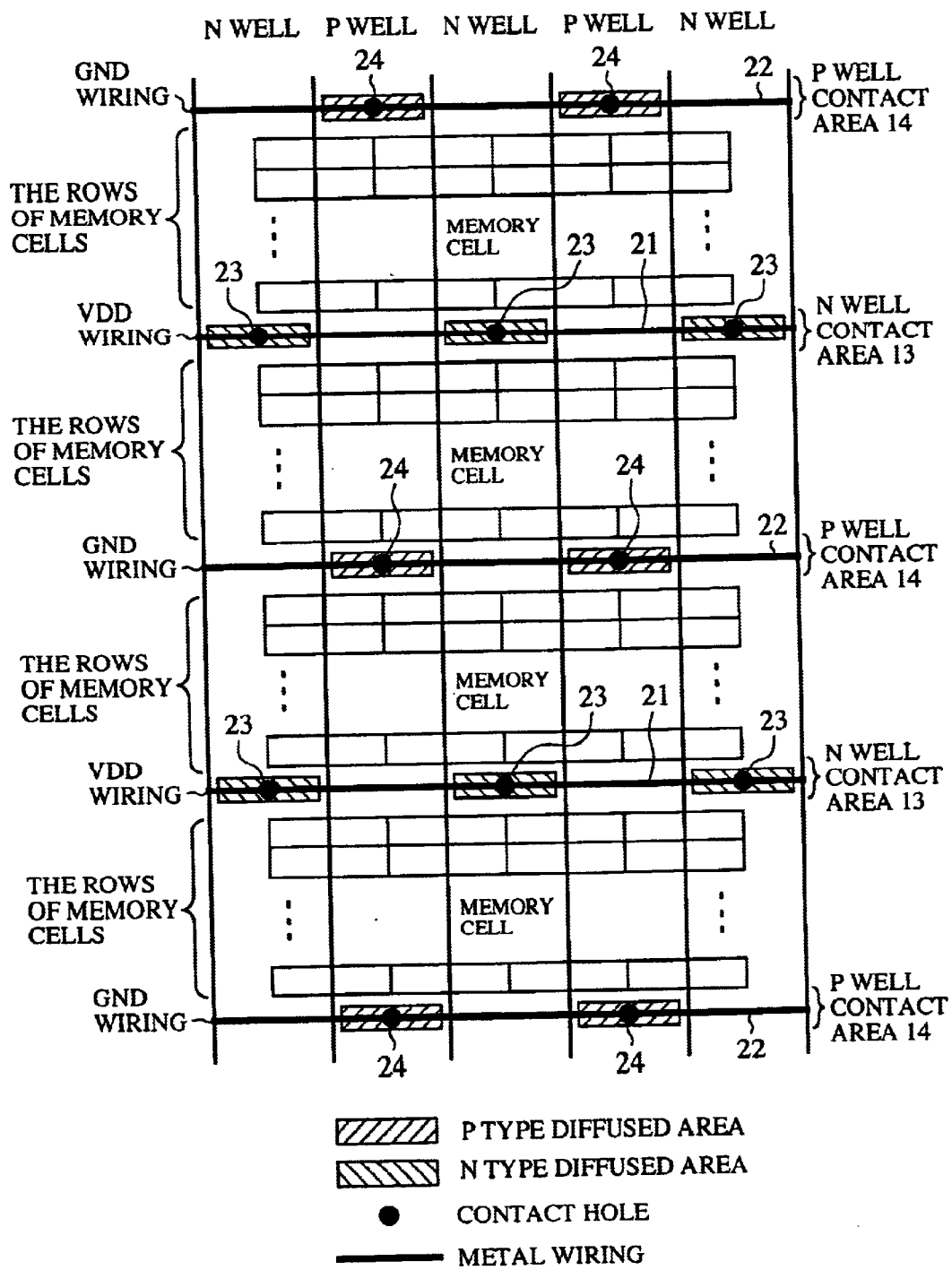
FIG. 2 is a wiring schematic diagram of the metal wiring of the semiconductor memory device.

Herein, FIG. 2 is a wiring schematic diagram of the metal wiring of the semiconductor memory device.

Referring to the figure, power line (referred to as VDD wiring hereinafter) 21 is a metal wiring wired within N well contact area 13, grounding conductor (referred to as GND wiring hereinafter) 22 is a metal wiring wired within P well contact area 14, contact hole 23 is used for giving the power supply potential VDD to the N well, and contact hole 24 is used for giving ground potential GND to the P well.

As is apparent from the above description, in the embodiment 1, because N well contact area 13 is arranged to be integrally formed with second diffused area 12 in the upper parts of the N well and the P well, and P well contact area 14 is arranged to be integrally formed with first diffused area 11 in the upper parts of the P well and the N well, N well contact area 13 and P well contact area 14 do not form independent and small islands. Accordingly, this may suppress the occurrence of the disappearance and fall of the resist, thereby controlling the occurrence of defectives in the manufacturing process.

Embodiment 2

Figure 3:
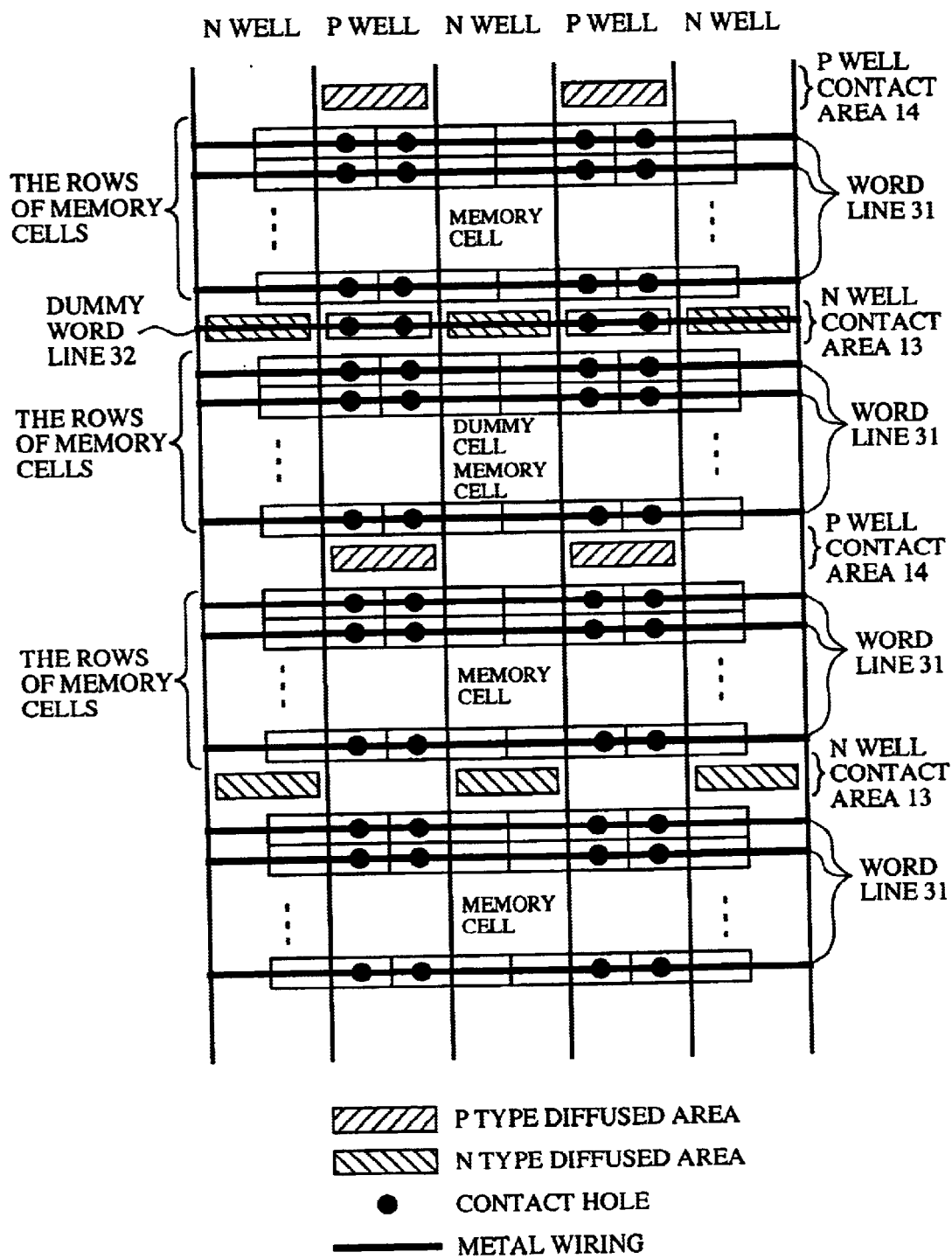
FIG. 3 is a wiring schematic diagram of the word line of the semiconductor memory device.
Figure 4:
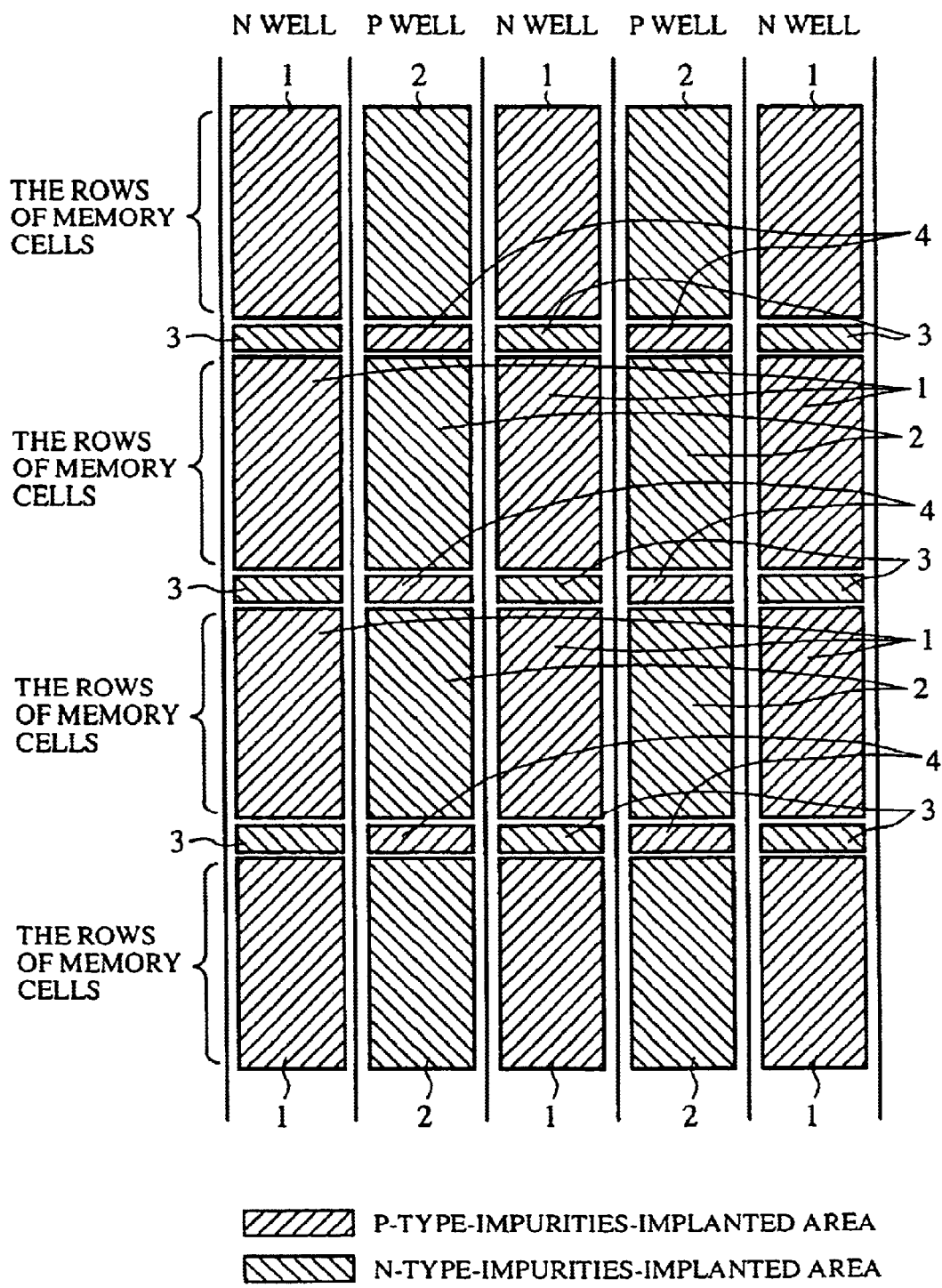
FIG. 4 is a top surface view of the main part showing a conventional semiconductor memory device.

Although not mentioned particularly in the embodiment 1, word line 31 is wired on every row of the memory cells as shown in FIG. 3.

Here, in order to absorb a slight time lag caused by manufacturing variations, timing-control technique using a dummy cell, word line or bit line came into common use.

In the embodiment 2, dummy word line (a signal line for timing adjustment) 32 is wired in N well contact area 13 (optionally, dummy word line 32 may be wired in P well contact area 14), and at the same time each of the transistors is connected with dummy word line 32 by forming a dummy NMOS access transistor in first diffused area 11.

Thereby, the wiring load of dummy word line 32 becomes equivalent to the wiring load of normal word line 31. Accordingly, even if the load of normal word line 31 increases because of manufacturing variations, timing shifts with the same tendency because the load of dummy word line 32 similarly increases. Therefore, because a decrease in a timing margin can be suppressed, a malfunction can be prevented.

According to the embodiment 2, because dummy word line 32 is wired within N well contact area 13 or P well contact area 14 having room for wiring since the memory cell does not exist therein, the effect that the malfunction can be prevented without forming a specific area for wiring dummy word line 32 is obtained. That is, the effect that the malfunction can be prevented without widening the area of the semiconductor memory device is obtained.

What is claimed is:

1. A semiconductor memory device comprising:
   a first diffused area into which P type impurities were implanted which is formed within the upper part of a strip-of-paper-shaped N well;
   a second diffused area into which N type impurities were implanted which is formed within the upper part of a strip-of-paper-shaped P well adjacent to the N well;
   a N well contact area integrally formed with the second diffused area within the upper parts of the N well and the P well; and
   a P well contact area integrally formed with the first diffused area within the upper parts of the P well and the N well.

2. A semiconductor memory device according to claim 1, wherein the N well contact area and the P well contact area are alternately formed in the direction of a row.

3. A semiconductor memory device according to claim 2, wherein a power line for supplying electric power to the N well is wired within the N well contact area, and a grounding conductor for grounding the P well is wired within the P well contact area.

4. A semiconductor memory device according to claim 2, wherein at least one row of memory cells is formed between the N well contact area and the P well contact area.

5. A semiconductor memory device according to claim 2, wherein a signal line for timing adjustment is wired within the N well contact area.

6. A semiconductor memory device according to claim 2, wherein a signal line for timing adjustment is wired within the P well contact area.

* * * * *